United States Patent
Onizuka et al.

(10) Patent No.: US 7,137,829 B2
(45) Date of Patent: Nov. 21, 2006

(54) ELECTRIC POWER DISTRIBUTION UNIT FOR ELECTRIC CONNECTION BOX AND ELECTRIC CONNECTION BOX

(75) Inventors: Takahiro Onizuka, Nagoya (JP); Yukinori Kita, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 741 days.

(21) Appl. No.: 10/349,102

(22) Filed: Jan. 23, 2003

(65) Prior Publication Data
US 2003/0168432 A1  Sep. 11, 2003

(30) Foreign Application Priority Data
Jan. 23, 2002  (JP) .............................. 2002-014012

(51) Int. Cl.
*H01R 12/00*  (2006.01)
(52) U.S. Cl. ..................................................... 439/76.2
(58) Field of Classification Search ................ 439/590, 439/76.2, 736, 949, 751
See application file for complete search history.

(56) References Cited

U.S. PATENT DOCUMENTS

| 6,494,723 | B1 * | 12/2002 | Yamane et al. ............ 439/76.2 |
| 6,503,090 | B1 * | 1/2003 | Onizuka ...................... 439/75 |
| 6,599,136 | B1 * | 7/2003 | Sheldon et al. ............... 439/92 |
| 6,761,567 | B1 * | 7/2004 | Onizuka et al. ........... 439/76.2 |
| 2001/0028197 | A1 | 10/2001 | Yamane et al. | |

FOREIGN PATENT DOCUMENTS

JP   A 2001-319708   11/2001

* cited by examiner

Primary Examiner—Khiem Nguyen
(74) Attorney, Agent, or Firm—Oliff & Berridge, PLC

(57) ABSTRACT

Unit-forming bus bars including input terminal bus bars and output terminal bus bars are secured through an insulation layer to a rear surface of a heat radiation member that is exposed outside an electric connection box case, and switching devices are mounted on the bus bars. Relay switches that are different from the switching devices are mounted on a relay board. The relay board and a control circuit board for controlling driving of the switching devices are disposed on a surface facing away from the rear surface of the heat radiation member, and are parallel to each other.

12 Claims, 4 Drawing Sheets

ELECTRIC POWER DISTRIBUTION UNIT FOR ELECTRIC CONNECTION BOX AND ELECTRIC CONNECTION BOX

BACKGROUND OF THE INVENTION

1. Field of the Invention

This invention relates to an electric power distribution unit constituting an electric power distribution circuit extending from a vehicle-mounted electric power source in a vehicle such as an automobile or the like, and to an electric connection box having the unit.

2. Description of Related Art

Heretofore, an electric connection box, in which an electric power distribution circuit is formed by stacking a plurality of bus bar boards, and in which fuses and relay switches are incorporated for distributing electric power from a common vehicle-mounted electric power source to various electronic unit, has been generally known.

Further, in order to reduce a size of such electric connection box and to implement switching control, an electric connection box has been developed recently in which semiconductor switching devices, such as field effect transistors (FETs) or the like are interposed between input and output terminals in lieu of the relay switches.

However, since these semiconductor switching devices have a relatively great calorific power, it is necessary to efficiently remove heat from the devices.

An electric connection box is disclosed in, for example, Japanese Laid-Open Patent Application No. 2001-319708 as one way of solving the problem. The electric connection box includes an electric power distribution section having an input terminal to be connected to an electric power source, output terminals, semiconductor switching devices interposed between the input and output terminals, and a bus bar circuit section, having a metallic bus for forming a circuit and an insulation plate stacked on the bus bar, for connecting the respective output terminals of the electric power distribution section to vehicle-mounted loads. The electric power distribution section and bus bar circuit section are assembled in a common case with a part of bus bars in the bus bar circuit section being connected to the respective output terminals of the electric power distribution section.

In more detail, in the above-described electric connection box, the input terminal bus bar and the plurality of output terminal bus bars are disposed at a rear side of the heat radiation member, semiconductor switching devices are interposed between the input and output terminal bus bars for switching an ON-OFF energization of the input and output terminal bus bars, and heat generated from the semiconductor switching devices is radiated through the heat radiation member to the outside.

According to such an electric connection box, since the electric power distribution section including the semiconductor switching devices and heat radiation member is provided independently of the bus bar board as an electric power distribution unit, it is possible to efficiently cool the respective semiconductor switching devices at a single position concentrically.

Although switching means for switching an ON-OFF energization of the input and output terminals consist of only the semiconductor switching devices in the above-mentioned disclosure, there are occasions where the semiconductor switching devices alone cannot carry out the ON-OFF energization in a special specification. In this case, it is necessary to use conventional relay switches and semiconductor switching devices together.

SUMMARY OF THE INVENTION

However, the relay switch is larger in size than the semiconductor switching device, as described above. If such a relay switch is incorporated in the bus bar board in the same conventional manner, the space occupied by the bus bar board will increase, and thus the electric connection box will become large in size. Consequently, the structure of the bus bar board itself will be complicated.

In view of the above-described problems, an object of the present invention is to provide an electric power distribution unit that has switching devices, such as semiconductor switching devices, and relay switches as a switching device in an electric power distribution circuit and that is easily incorporated in an electric connection box, and to downsize the electric connection box and to simplify the structure of a bus bar board of the box.

In order to solve the above-described problems, the present invention is directed to an electric power distribution unit for an electric connection box. The electric power distribution unit includes: a heat radiation member; a plurality of unit-forming bus bars connected to a surface of the heat radiation member, the unit-forming bus bars constituting a first electric power distribution circuit; a plurality of switching devices mounted on the unit-forming bus bars; a control circuit board that controls driving of the switching devices; and a relay board provided independently of the control circuit board, having a second electric power distribution circuit different from the first electric power distribution circuit, a relay switch being disposed in the second electric power distribution circuit. The relay board and the control circuit board are arranged facing the surface of the heat radiation member with the relay board and the control circuit board being substantially in parallel with each other.

According to the above construction, a plurality of switching devices are mounted on the front surface of the heat radiation member, so it is possible to efficiently and concentratedly cool the switching devices by the heat radiation member and to control driving of the respective switching devices by a control circuit mounted on the control circuit board.

In addition, since the relay board mounting the electric power distribution circuit using the relay switch is disposed in the electric connection box independently of the electric power distribution circuit using the switching devices, it is possible to easily incorporate a plurality of electric power distribution circuit systems including a switching device, such as a semiconductor switching device, and a relay switch in the electric connection box without complicating a body-side circuit of the electric connection box (e.g., an electric power circuit formed by a bus bar board) by incorporating the electric power distribution unit in the electric connection box directly. Also, since the control circuit board and the relay board are arranged facing the surface of the common heat radiation member with the relay board and the control circuit board being substantially in parallel with each other, the whole structure becomes compact in size. When the heat radiation member is incorporated in the case of the electric connection box and faces outside the case, the control circuit board and the relay board face the inner part of the case. This results in protecting the boards against any objects disposed outside the case.

In order to electrically interconnect the switching devices and the control circuit board on the surface of the heat radiation member, preferably, for example, portions of the unit-forming bus bars to which the switching devices are mounted include bent-up portions that form board connection terminals standing up from the surface of the heat radiation member, and the control circuit board is connected to the board connection terminals. According to this construction, it is possible to electrically interconnect the switching devices and the control circuit board by a simple structure in which portions of the unit-forming bus bars are bent up.

In order to connect the control circuit board to an external circuit (e.g., a control circuit mounted on a vehicle), preferably, for example, a control circuit board connector that interconnects the control circuit board and an external circuit is mounted on a surface of the control circuit board that faces away from the heat radiation member. According to this construction, since the control circuit board and the external board are easily interconnected by utilizing the control circuit board connector, and the connector is mounted on the surface of the control circuit board that faces away from the heat radiation member, it is possible for the control circuit board to be close to the first side of the heat radiation member. This results in decrease of a distance between the control circuit board and the switching devices.

Also, a relay board connector that interconnects the electric power distribution circuit and an external circuit is mounted on the relay board. According to this construction, it is possible to easily interconnect the electric power distribution circuit on the relay board and the external circuit by utilizing the relay board connector, and to effectively radiate the heat generated from the relay switch through the wire harness connected to the relay board connector outside the unit. That is, it is possible to efficiently cool the switching devices through the heat radiation member and to cool the relay switches through the wire harness connected to the relay switch board connector.

If the relay board connector and the relay switch are mounted on the same surface of the relay board, it is possible to greatly reduce the overall size of the relay board (for example, the dimension in the thickness direction of the board) in comparison with a structure in which the relay board connector and the relay switches are mounted on opposite surfaces.

Furthermore, the relay switches and relay board connector are mounted on a surface of the relay board that faces a surface of the heat radiation member. According to this construction, the relay switch can be close to the heat radiation member. Consequently, it is possible to effectively lower an atmospheric temperature around the relay switch by utilizing a cooling function of the heat radiation member.

In addition, the relay board is spaced from the surface of the heat radiation member by a distance greater than the control circuit board is spaced from the surface of the heat radiation member, and a control circuit board connector that interconnects the control circuit board and an external circuit is mounted on a surface of the control circuit board that faces away from the heat radiation member.

In an electric connection box, a bus bar board includes a plurality of bus bars, the bus bar board is accommodated in a case, and the input and output terminal bus bars of the electric power distribution unit are electrically connected to the bus bar board.

According to this electric connection box, electric power inputted from the bus bar board of the electric connection box to the input terminal bus bar of the electric power distribution unit is returned to the bus bar board through the respective switching devices and output terminal bus bars that are cooled together by the heat radiation member, thereby being distributed to, for example, vehicle-mounted loads.

Further, the bus bar board is provided along an outer wall of the case, the outer wall is provided with electrical component-fitting portions for receiving electrical components, such as fuse elements, and a board connector mounted on at least one of the control circuit board and the relay board is oriented in a direction opposite to the electrical component-receiving portion. Accordingly, it is possible to incorporate the electric power distribution unit in the case of the electric connection box in a compact manner without interference between the electrical component-fitting portion and the relay board connector.

BRIEF DESCRIPTION OF THE DRAWINGS

The foregoing and other features of the present invention will become apparent from the following detailed description of exemplary embodiments with reference to the accompanying drawings, wherein.

DETAILED DESCRIPTION OF PREFERRED EMBODIMENTS

Figure 1:
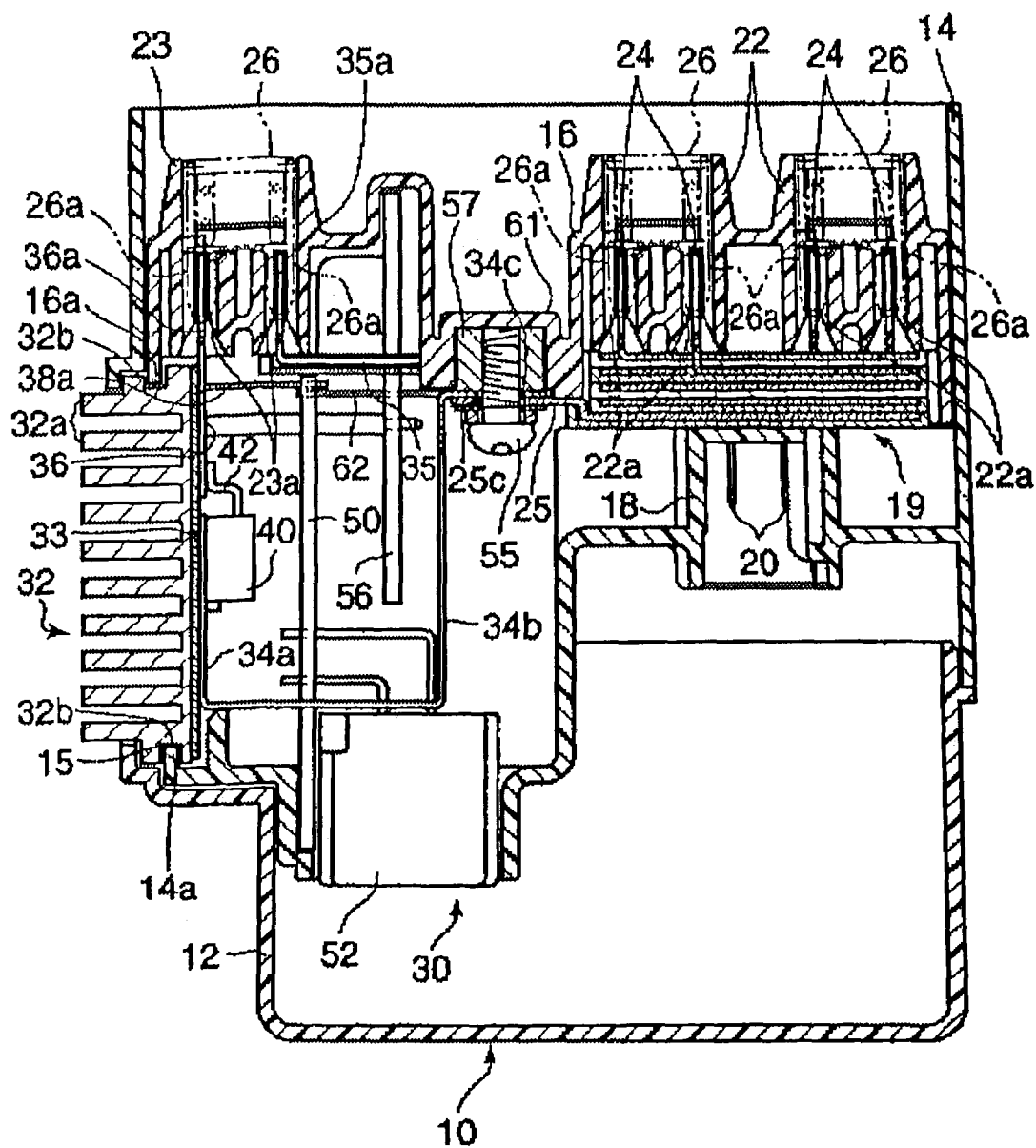
FIG. 1 is a front sectional view of an embodiment of an electric connection box in accordance with the present invention.

Referring now to the drawings, an exemplary embodiment of an electric connection box in accordance with the present invention will be described below.

Figure 2:
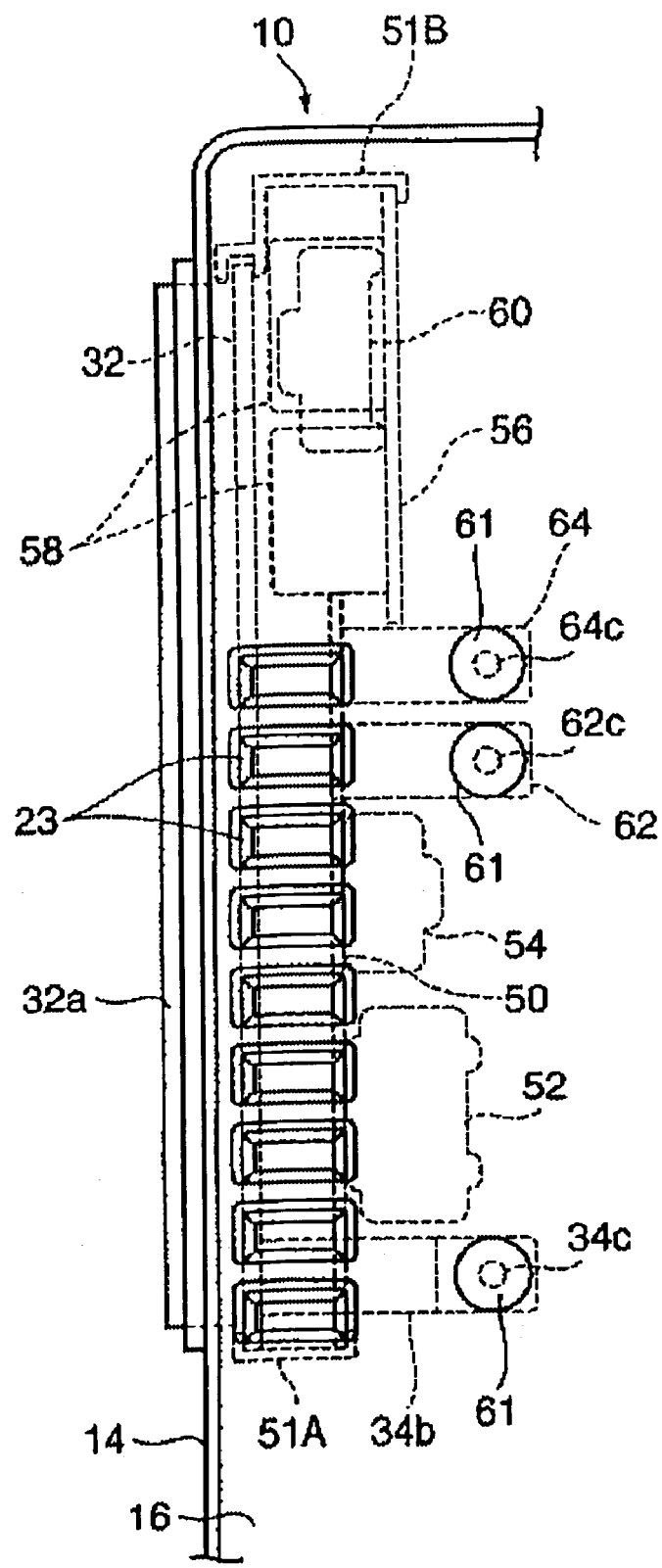
FIG. 2 is a plan view of a main part of the electric connection box shown in FIG. 1.
Figure 3:
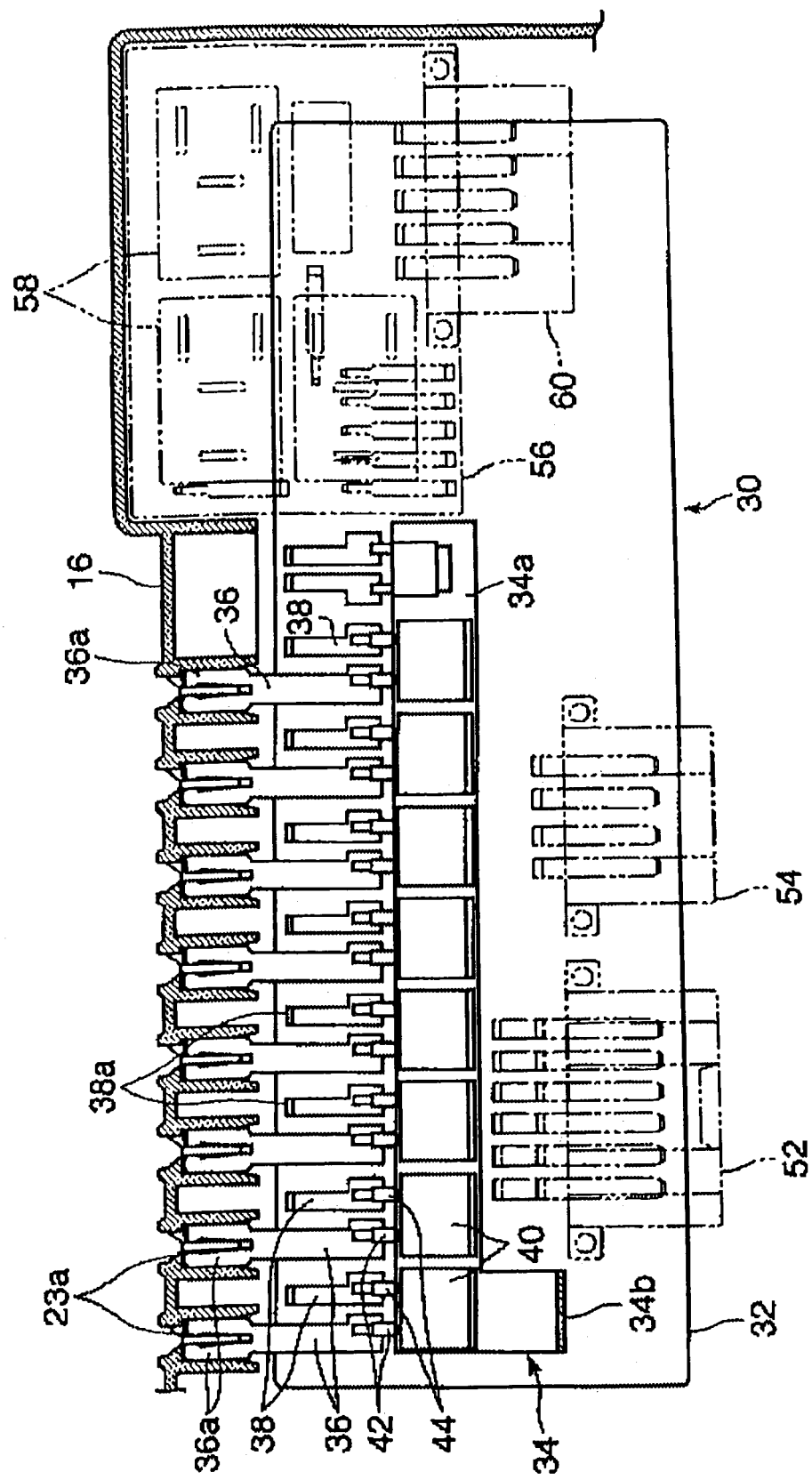
FIG. 3 is a partially sectional side elevation view of an arrangement of each bus bar of a power distribution unit in the electric connection box.

An electric connection box shown in FIGS. 1 to 3 includes a lower case 12, an upper case 14 stacked on the lower case 12, and a case cover 16 mounted on the upper case 14. The upper and lower cases 14 and 12 and case cover 16 may be made of an insulating material, such as a synthetic resin material or the like, to form a case (insulating case) of the present invention.

Each of the upper and lower cases 14 and 12 may be formed in the shape of an open container with a bottom wall. An upper side of the lower case 12 covers a bottom wall of the upper case 14.

A bus bar board 19 is contained in the upper case 14. The bus bar board may be formed by stacking a plurality of bus bars and insulation plates one after the other to make an electric power circuit.

The bottom wall of the upper case 14 is provided with a plurality of connector housings (hereinafter referred to "connector housing 18" or "connector housings 18", although only one connector housing 18 is shown in FIG. 1) that are open in the bottom side. Bus bar ends 20 extend downwardly from the bus bar board 19 and pass downwardly through upper walls of the connector housings 18. The bus bar ends 20 and connector housings 18 constitute connectors that can be coupled to external connectors (not shown). That is, the external connectors may be coupled to the connector housings 18, and terminals of the external connectors may be coupled to the bus bar ends 20, thereby electrically connecting external circuits (for example, an electric power source circuit and a load side circuit) through the external connectors to the electric power circuit formed by the bus bar board 19.

The case cover 16 is mounted on the upper case 14 to close the opening of the upper case 14. The case cover 16 is provided with a plurality of electrical component-fitting portions 22 above the bus bar board 19 and a plurality of fuse-fitting portions 22 and 23. In this invention, the electrical component 26 is a fuse element.

Each of the electrical component-fitting portions 22 and 23 has a configuration in which an electrical component 26 shown by two-dot chain lines in FIG. 1 can be fitted. Each of the electrical components 26 has a pair of electrical component terminals 26a extending downwardly from its body while the respective electrical component-fitting portions 22 and 23 have terminal-receiving portions 22a and 23a in which the respective electrical component terminals 26a can be inserted.

Bus bar ends 24 extend upwardly from the bus bar board 19 and are inserted into the terminal-receiving portions 22a. The electrical component terminals 26a inserted in the respective terminal-receiving portions 22a engage the bus bar ends 24 and are thus electrically connected to the bus bar board 19.

An electrical component connection structure in the electrical component-fitting portions 23 will be described in more detail below.

One of side walls of the upper case 14, that is adjacent the electrical component-fitting portions 23, is provided with an opening 15 that accommodates an electric power distribution unit 30. The electric power distribution unit 30 is fitted and secured in the opening 15.

Figure 4:
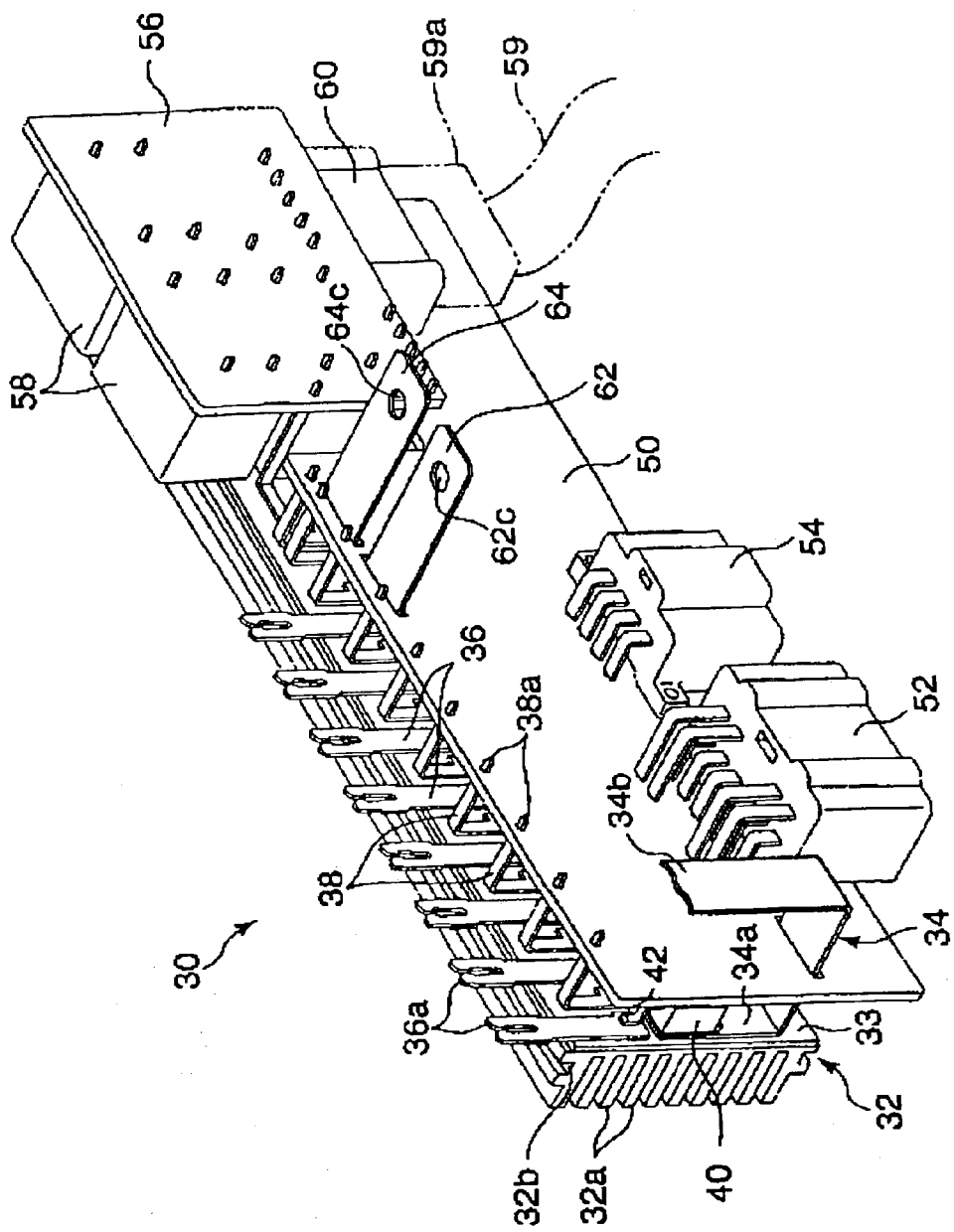
FIG. 4 is a perspective view of the power distribution unit.

The electric power distribution unit 30, as shown in FIGS. 3 and 4, includes a heat radiation member 32, a bus bar 34 for an input terminal (input terminal bus bar), a plurality of bus bars 36 for output terminals (output terminal bus bars), a plurality of bus bars 38 for connecting the board (board connection bus bars), a plurality of switching devices such as semiconductor switching devices (power MOSFETs 40 illustrated in the drawings; hereinafter referred to as "FETs 40"), a drive control board 50, and a relay board 56 on which a plurality of relay switches are mounted.

The heat radiation member 32 includes a plurality of heat radiation fins 32a that may have plate-like configurations and may project outwardly from an outer surface of the member. The heat radiation member 32 may be made of a material having a high heat conductivity (or high specific heat), such as an aluminum alloy or a copper alloy. The heat radiation member 32 is preferably secured to the upper case 14 in such a manner that an end surface of the heat radiation member 32 is disposed substantially parallel to the bus bar board 19 while the rear surface of the heat radiation member 32 is disposed substantially perpendicular to the bus bar board 19. In more detail, the heat radiation member 32 is provided with a groove 32b that engages the opening 15 which is formed by an open lower edge 14a of the upper case 14 and a lower end of a sidewall of the case cover 16.

The respective bus bars 34, 36, and 38 may be fixed on the rear surface of the heat radiation member 32 by an adhesive or the like and may be arranged as shown in FIG. 3. Assuming that the heat radiation member is conductive, an electrically insulating layer 33 is interposed between the heat radiation member 32 and the bus bars 34, 36 and 38.

The input terminal bus bar 34 includes a drain connection portion 34a (a portion for mounting the switching devices) and an input terminal portions 34b. The drain connection portion 34a extends in parallel with the rear surface of the heat radiation member 32. A plurality of FETs 40 (eight FETs in the illustrated embodiment) are mounted and arranged longitudinally on a surface of the drain connection portion 34a. The input terminal portion 34b extends from an end of the drain connection portion 34a (left end in FIG. 3) to an inner part of the upper case 14 and extends upwardly to the bus bar board 19, as shown in FIGS. 1 and 4, to be connected to the bus bar board 19.

In more detail, a distal end of the input terminal portion 34b extends horizontally and is provided with a bolt-passing hole 34c shown in FIG. 2. An input bus bar 25 for an electric power source extend from the bus bar board 19 toward the electric power distribution unit 30. A bolt-passing hole 25c is formed in a distal end of the input bus bar 25. An upwardly-raised nut-fixing portion 61 is provided in the case cover 16 at a position corresponding to the bolt-passing hole 25c. A nut 57 is embedded in the nut-fixing portion 61. A bolts 55 is inserted upwardly through the bolt-passing holes 34c and 25c in the input terminal portion 34b and electric power source input bus bar 25 and is screwed into the nut 57, thereby securing the input terminal portion 34b and electric power source input bus bar 25 to the nut 57 and electrically connecting them to each other.

Output terminal bus bars 36 and corresponding board connection bus bars 38 (FIG. 3) may be formed into strip-like configurations and may be arranged in a direction along the top surface of the heat radiation member 32, in a direction parallel to an arrangement direction of the FETs 40 one after the other.

A lower end of each output terminal bus bar 36 may be disposed immediately above the drain connection portion 34a while an upper end of the bus bar 36 projects upward and extends beyond the top edge of the heat radiation member 32. The upper end of each bus bar 36 is provided with a bifurcated fork-like electrical component connection terminal (heat radiation member-side electrical component connection terminal) 36a in which a electrical component terminal 26a of the electrical component 26 can be forcedly inserted.

An electrical component connection bus bar 35 extends from the bus bar board 19 toward the electric power distribution unit 30 and is bent up at an end. An electrical component connection terminal (e.g., a fuse connection terminal) 35a is provided at the end of the bus bar 35. The electrical component connection terminal 35a (which, in this embodiment, has a bifurcated fork-like configuration in which the electrical component terminal 26a can be forcedly inserted) is formed in the same manner as the electrical component connection terminal 36a.

Both electrical component connection terminals 35a and 36a are inserted into terminal-receiving holes 23a in electrical component-receiving portions 23 in the case cover 16. The respective electrical component terminals 26a of the electrical component elements 26 inserted in the electrical component-receiving portions 23 may be forcedly inserted into the electrical component connection terminals 35a and 36a. That is, the electrical components 26 are bridged between the electrical component connection terminals 35a and 36a so that the terminals 35a and 36a are electrically connected through the electrical component element 26.

In the present invention, one or more of the electrical components may not be required. In the case of using the electrical components, for example, all of the electrical components may be incorporated on the bus bar board 19.

A lower end of each board connection bus bar 38 (see FIGS. 3 and 4) is disposed immediately above the drain connection portion 34a while an upper end of each bus bar 38 is bent up from the rear surface of the heat radiation member 32 toward an inner part of the upper case 14 (rightward in FIG. 1) to form a board connection terminal 38a.

Although the respective heat radiation member-side bus bars 34, 36, and 38 may be made of a single metallic plate in this embodiment, they may be made of a plurality of metallic plates depending on their arrangements, and the plural metallic plates may be connected to one another by jump lines or direct connection, e.g., by welding, soldering or the like.

Any suitable process and/or material may be used for forming the insulating layer 33 on the rear surface of the heat radiation member 32, and any suitable process and/or material may be used for securing the respective heat radiation member-side bus bars to the insulating layer 33. For example, an insulating sheet made of a silicone resin or the like may be adhered to the rear surface of the heat radiation member, and the heat radiation member-side bus bars may be secured on the insulation sheet. An adhesive having good electrical insulation and heat conductivity may be applied on the rear surface of the heat radiation member and the unit-forming bus bars may be adhered on the rear surface.

Each FET 40 may include a substantially rectangular parallelepiped body and a source terminal 42 and a gate terminal 44 provided on a sidewall of the body.

A drain of each FET 40 is exposed on a rear surface of the FET body. The body of each FET 40 is mounted on the drain connection portion 34a of the input terminal bus bar 34 by soldering or the like, thereby electrically connecting the drain of each FET 40 to the drain connection portion 34a. The source terminal 42 of the FET 40 is mounted on the corresponding output terminal bus bar 36 by soldering or the like, and the gate terminal 44 of the FET 40 is mounted on the corresponding board connection bus bar 38 by soldering or the like. That is, each FET 40 is mounted on these bus bars (heat radiation member-side bus bars) to bridge the common drain connection portion 34a and the respective output terminal bus bar 36 and board connection bus bar 38.

Regarding the switching devices in the present invention, it is possible to use various kinds of semiconductor devices or other devices having a switching function, such as transistors (e.g., an insulated gate bipolar transistor (IGBT) or an ordinary bipolar transistor), gate-turn-off thyristors (GTOs), or various other kinds of thyristors as well as the above mentioned metal-oxide semiconductor field effect transistors (MOSFETs) in accordance with the particular design parameters and requirements. Such switching devices may be devices on which are mounted, for example, semiconductor chips, or package devices.

Any suitable method may be used for interconnecting the switching devices and the respective terminals. For example, wire bonding may be used. It is also possible to select the number and arrangement of the switching devices and output terminals in accordance with the number and arrangement of respective electrical devices in a vehicle.

The control circuit board 50 includes a control circuit for controlling a drive of each FET 40, for example, a printed circuit board. The control circuit board 50 may be provided at any suitable portions with through-holes into which the board connection terminals 38a of the respective board connection bus bars 38 are inserted and secured by soldering (see FIG. 4). Consequently, the gate terminals 44 of the respective FETs 40 are electrically connected through the board connection bus bar 38 to the control circuit of the control circuit board 50, and the control circuit board 50 is disposed to oppose the rear surface of the heat radiation member 32.

Control circuit board connectors 52 and 54 to be connected to external circuits may be mounted on the control circuit board 50. The control circuit board connectors 52 and 54 may be mounted on the surface of the board 50 that faces away from the heat radiation member 32.

Furthermore, in the electric power distribution unit 30 in the present embodiment, a plurality of relay switches 58 such as have been used in a conventional electric connection box may be used together with the FETs 40 for ON-OFF switching of energization of the electric power distribution circuit.

Each relay switch 58 is mounted on a relay board 56 that is separated from the control circuit board 40. Although the relay board 56 together with the control circuit board 50 is disposed facing the rear surface of the heat radiation member 32, the relay board 56 is spaced away from the rear surface of the member 32 by a distance greater than the control circuit board 50 is spaced. The plural relay switches 58 and a connector 60 for external connection may be mounted on the surface of the relay board 56 that faces the rear surface of the heat radiation member 32. The connector 60 may be connected to an external connector 59a provided on a wire harness 59 for supplying electric power to a vehicle-mounted load, as shown in FIG. 4.

The control circuit board 50 and relay board 60 are held on the heat radiation member 32 by frame members 51A and 51B.

An electric power source input terminal 62 for supplying electric power to the control circuit board 50 and an electric power source input terminal 64 for supplying electric power to the relay board 56 are disposed in the electric power distribution unit 30, and extend toward the bus bar board 19. Electric power source input bus bars (not shown) similar to the electric power source input bus bar 25 extend from the bus bar board 19 toward the electric power distribution unit 30. The electric power source bus bar and the electric power source input terminals 62 and 64 may be interconnected in the same manner as the interconnecting structure of the electric power source input bus bars 25 and input terminal portion 34a (structure using a nut 57 embedded in the nut-fixing portion 61) shown in FIGS. 1 and 2. The respective electric power source input terminals 62 and 64 are provided with bolt-passing holes 62a and 64a shown in FIGS. 2 and 4. Similarly, the electric power source input bus bars are provided with bolt-passing holes (not shown). Bolts inserted through the bolt-passing holes are screwed into the nuts, thereby interconnecting the respective electric power source input terminals 62 and 64 and the electric power source input bus bars 25.

Next, an operation of the electric connection box will be explained below.

Electric power supplied from a vehicle-mounted battery (not shown) is inputted in the bus bar board 19 through an external connector coupled to a suitable connector housing (for example, a connector housing 18) formed in the upper case 14. This electric power is supplied from the electric power source input bus bar 25 of the bus bar board 19 to the input terminal bus bar 34 via the input terminal portion 34b. Then, the electric power is inputted into the drain of the FET 40 mounted on the drain connection portion 34a of the input terminal bus bar 34.

When the FET 40 is placed in an ON state, the electric power inputted to the drain is supplied from the output terminal bus bar 36 through the electrical component element 26 (e.g., fuse element fitted in the electrical component-fitting portion 23) into the electrical component connection bus bar 35 of the bus bar board 19. This electric power is supplied from the external connector coupled to an appropriate connector housing of the upper case 14 to a given electric load (for example, vehicle-mounted electric equipment). In contrast, when the FET 40 is placed in an OFF state, even if the electric power is inputted to the drain, the electric power is not transmitted to the output terminal bus bar 36. That is, the electric power distribution circuit is cut off.

The control circuit assembled in the control circuit board 50 controls the ON-OFF operation of the FET 40. In more detail, an operation signal (for example, a switch signal) transmitted from a circuit outside the electric connection box is inputted through the connectors 52 and 54 into the control circuit of the control circuit board 50. In response to the operation signal, the control circuit sends a control signal through the board connection bus bar 38 to the gate terminal 44 of the appropriate FET 40, thereby controlling an ON-OFF switching operation of energization between the drain and source of the FET 40.

Electric power from the vehicle-mounted electric power source is inputted from the electric power source input terminal 64 through the bus bar board 19 to the relay board 56. The relay switches 58 and the relay board connector 60 mounted on the relay board 56 further supply electric power through the wire harness 59 to each portion of the vehicle. The ON-OFF switching operation of the relay switches 58 controls the electric power distribution in the relay board 56.

In the electric connection box described above, some of the conventional mechanical relay switches that have been incorporated in a bus bar circuit may be exchanged for FETs 40, and the FETs 40 may be mounted on surfaces of the heat radiation member-side bus bars 34, 36, and 38 secured to the common heat radiation member 32. Accordingly, it is possible to efficiently cool the respective FETs 40 at the same time. Since the relay switches 58 that are used together with the FETs 40 are mounted on the relay board 56, and since the relay board 56 and the control circuit board 50 for controlling the FETs 40 are disposed to face away from the rear surface of the heat radiation member 32 while the relay board 56 is substantially parallel with the control circuit board 50, it is possible to assemble the control circuits of the FETs 40 and the relay circuit with a compact structure and to effectively remove heat generated from the relay switches 58 from the relay board connector 60 mounted on the relay board 56 through the wire harness to the outside of the case.

Since the relay board 56, the control circuit board 50 and the FETs 40 are located on the inner side of the upper case 14, while the heat radiation member 32 is mounted on the front side (right side of FIG. 1) of the upper case 14, it is possible to effectively protect the relay board 56 and the control circuit board 50 and FETs 40 against any objects outside the case.

In the present invention, material for interconnecting the FETs 40 and the control circuit board 50 may be, for example, a special wiring material. However, if the board connection bus bars 38 mounting the gate terminals 44 of the FETs 40 are bent up to form the board connection terminals 38a, and if the control circuit board is connected to the terminals 38a, as shown in the above-described embodiment, it is possible to electrically interconnect the FETs 40 and the control circuit board 50 by a simple structure.

According to the present invention, the determination of whether to include the control circuit board connectors 52 and 54 and/or the relay board connector 60 may be carried out in accordance with the particular design parameters and specifications.

Although arrangement of these connectors is not limited, the arrangement illustrated in the drawings can obtain the following effects.

Since the control circuit board connectors 52 and 54 are mounted on the surface of the control circuit board 50 facing away from the heat radiation member 32, it is possible for the control circuit board 50 to be close to the rear surface of the heat radiation member 32, thereby reducing a connection distance between the control circuit board 50 and the FETs 40 (a projection amount of the board connection bus bars 38).

Since the relay board connector 60 is mounted on the surface of the relay board 56 on which the relay switches 58 are mounted, it is possible to greatly reduce the overall size of the relay board 56 (particularly the dimension in the thickness direction of the board) in comparison with a structure in which the connector 60 and the relay switches 58 are not mounted on the same surface of the relay board 56. Since the relay switches 58 and the relay board connector 60 are mounted on the surface of the relay board 56 that faces the rear surface of the heat radiation member 32, it is possible for the relay switches 58 to be close to the heat radiation member 32 and to effectively lower an atmospheric temperature around the relay switch by using a cooling function of the heat radiation member 32.

Furthermore, since the connectors 52, 54, and 60 are mounted with the relay board 56 being spaced away by a greater distance from the rear surface of the heat radiation member 32 than the control circuit board 50, it is possible to arrange these connectors in a compact manner and to reduce the overall size of the unit (particularly the dimension in the thickness direction of the heat radiation member and each board).

Also, since the bus bar board 19 is provided along the case cover 16, the electrical component-fitting portions 22 for supporting the electrical components 26 are provided on the case cover 16, and the control circuit board connectors 52 and 54 and the relay board connector 60 are located on the opposite side with respect to the fuse-fitting portions 22, it is possible to incorporate the electric power distribution unit 30 in the upper case 14 in a compact manner without interference of the electrical component-fitting portions 22 with the respective connectors 52, 54, and 60.

According to the above construction, since the input and output terminal bus bars are fixed via the insulation layer on the rear surface of the common heat radiation member, and plural switching devices are mounted on the front surface of the heat radiation member, it is possible to efficiently and concentratedly cool the switching devices by the heat radiation member and to control driving of the respective switching devices by the control circuit mounted on the control circuit board.

In addition, the relay board mounting the electric power distribution circuit using the relay switch is disposed in the electric connection box independently of the electric power distribution circuit using the switching devices, and the control circuit board and relay board are arranged facing the rear surface of the common heat radiation member with the boards being substantially in parallel with each other. Therefore, it is possible to easily incorporate an electric power distribution circuit including a switching device and an electric power distribution circuit including a relay switch as a switching device in the electric connection box without complicating a body side circuit of the electric connection box by incorporating the electric power distribution units in the electric connection box directly. It is also possible to protect the boards against any objects outside the case.

While the invention has been described in conjunction with the specific embodiments described above, many equivalent alternatives, modifications and variations may become apparent to those skilled in the art when given this disclosure. Accordingly, the exemplary embodiments of the invention as set forth above are considered to be illustrative and not limiting. Various changes to the described embodiments may be made without departing from the spirit and scope of the invention.

The entire disclosure of Japanese Patent Application No. 2002-014012 filed on Jan. 23, 2002, including the specification, claims, drawings and abstract, is incorporated herein by reference in its entirety.

What is claimed is:

1. An electric power distribution unit, comprising:
   a heat radiation member;
   a plurality of unit-forming bus bars connected to a first surface of said heat radiation member, the unit-forming bus bars constituting a first electric power distribution circuit;
   a plurality of switching devices mounted on said unit-forming bus bars;
   a control circuit board that controls driving of said switching devices; and
   a relay board provided independently of said control circuit board, having a second electric power distribution circuit different from said first electric power distribution circuit, a relay switch being disposed in said second electric power distribution circuit;
   wherein said relay board and said control circuit board are arranged facing the first surface of said heat radiation member with said relay board and said control circuit board being substantially in parallel with each other.

2. An electric power distribution unit according to claim 1, wherein portions of said unit-forming bus bars to which said switching devices are mounted comprise bent-up portions that form board connection terminals standing up from the first surface of said heat radiation member, and said control circuit board is connected to said board connection terminals.

3. An electric power distribution unit according to claim 1, wherein a control circuit board connector that interconnects said control circuit board and an external circuit is mounted on a surface of said control circuit board that faces away from said heat radiation member.

4. An electric power distribution unit according to claim 1, wherein a relay board connector that interconnects said second electric power distribution circuit and an external circuit is mounted on said relay board.

5. An electric power distribution unit according to claim 4, wherein said relay board connector and said relay switch are mounted on a same surface of said relay board.

6. An electric power distribution unit according to claim 5, wherein said relay switch and relay board connector are mounted on a surface of said relay board that faces the first surface of said heat radiation member.

7. An electric power distribution unit according to claim 5, wherein:
   said relay board is spaced from the first surface of said heat radiation member by a distance greater than said control circuit board is spaced from the first surface of said heat radiation member, and
   a control circuit board connector that interconnects said control circuit board and an external circuit is mounted on a surface of said control circuit board that faces said heat radiation member.

8. An electric power distribution unit according to claim 1, wherein said unit-forming bus bars include an input terminal bus bar and a plurality of output terminal bus bars, and said plurality of switching devices connect said input terminal bus bar and said output terminal bus bars.

9. An electric connection box, comprising:
   a case with a heat radiation member opening formed therein; and
   an electric power distribution unit according to claim 1 accommodated in said case, a portion of said heat radiation member being exposed outside said case through said heat radiation member opening.

10. An electric connection box according to claim 9, further comprising a bus bar board including a plurality of bus bars, said bus bar board being accommodated in said case, and said input and output terminal bus bars of said electric power distribution unit being electrically connected to said bus bar board.

11. An electric connection box according to claim 10, wherein said bus bar board is provided along an outer wall of said case, said outer wall is provided with at least one electrical component-fitting portion that receives an electrical component, and at least one board connector mounted on at least one of said control circuit board and said relay board is oriented in a direction facing said at least one electrical component-receiving portion.

12. An electric connection box according to claim 11, wherein said electrical component is a fuse element.

* * * * *